(12) United States Patent
Lin et al.

(10) Patent No.: US 9,142,641 B1
(45) Date of Patent: Sep. 22, 2015

(54) METHOD FOR MANUFACTURING FINFET

(71) Applicant: UNITED MICROELECTRONICS CORPORATION, Hsinchu (TW)

(72) Inventors: Chao-Hung Lin, Changhua (TW); Shih-Hung Tsai, Tainan (TW); Ssu-I Fu, Kaohsiung (TW); Jyh-Shyang Jenq, Tainan (TW)

(73) Assignee: UNITED MICROELECTRONICS CORPORATION, Hsinchu (TW)

( * ) Notice: Subject to any disclaimer, the term of this patent is extended or adjusted under 35 U.S.C. 154(b) by 0 days.

(21) Appl. No.: 14/516,545

(22) Filed: Oct. 16, 2014

(30) Foreign Application Priority Data

Sep. 18, 2014 (TW) .............................. 103132321 A

(51) Int. Cl.
  *H01L 21/02* (2006.01)
  *H01L 29/66* (2006.01)
  *H01L 21/311* (2006.01)
  *H01L 21/3105* (2006.01)
  *H01L 21/308* (2006.01)

(52) U.S. Cl.
  CPC .......... *H01L 29/6656* (2013.01); *H01L 21/022* (2013.01); *H01L 21/3086* (2013.01); *H01L 21/31051* (2013.01); *H01L 21/31116* (2013.01); *H01L 29/66795* (2013.01)

(58) Field of Classification Search
  CPC .............. H01L 29/6656; H01L 21/022; H01L 21/3086; H01L 21/31051; H01L 21/31116
  See application file for complete search history.

(56) References Cited

U.S. PATENT DOCUMENTS

| | | |
|---|---|---|
| 6,063,688 A | 5/2000 | Doyle |
| 2015/0056724 A1* | 2/2015 | Shieh et al. .................... 438/14 |

OTHER PUBLICATIONS

U.S. Appl. No. 13/786,485, filed Mar. 6, 2013, First Named Inventor: Tsai, Shih-Hung, Title: Method for Forming Fin-Shaped Structures.

* cited by examiner

*Primary Examiner* — Nadine Norton
*Assistant Examiner* — Mahmoud Dahimene
(74) *Attorney, Agent, or Firm* — Ding Yu Tan

(57) ABSTRACT

A method for manufacturing a FinFET includes forming a merging spacer, through a plurality of sidewall pattern-transferring processes, and modifying a first interval between adjacent first mandrels as shorter than twice of thicknesses of a nitride layer, which is formed on the first mandrels and contoured thereto, followed by a first spacer being formed on a sidewall thereof, so that a FinFET composed of a plurality of fin-shaped structures having a non-integral multiple of pitches as well as an integral multiple of pitches can be manufactured.

10 Claims, 14 Drawing Sheets

METHOD FOR MANUFACTURING FINFET

FIELD OF THE INVENTION

The invention relates to a method for manufacturing a transistor, and more particularly to a method for manufacturing a fin field-effect transistor (FinFET).

BACKGROUND OF THE INVENTION

In the present generation of tremendous advancement of technology, when pursuing the miniaturization of device, it is also necessary to enhance the performance thereof simultaneously. In contrast to a conventional planar field-effect transistor, it is more appropriate for a fin field-effect transistor (hereinafter referred to as FinFET) to dominate the current therethrough, while alleviate the leakage current and dynamic power dissipation. In the trend of the miniaturization of device, the FinFET has been shrunk in a nanometer scale.

However, due to the restriction of a resolution limit of the photolithography process, the current photolithography process technology is not applicable to the exposure of photoresist patterns with a pitch less than 78 nm. With such a photolithography process technology, it is impossible to increase the density of fin-shaped structures, and difficult to shrink the device's size. Moreover, the current photolithography process technology is just suitable to manufacture fin-shaped structures, in which the patterns are merely characterized by an integral multiple of pitches, needless to say, unable to manufacture a single device, in which the fin-shaped structures are both characterized by an integral multiple of pitches and a non-integral multiple of pitches. That is to say, the conventional photolithography process technology has failed to fulfill the requirement of various fin-shaped structures of respective functional areas in a device.

In view of the aforementioned reasons, there is a need to provide an improved method for manufacturing a FinFET for solving the above mentioned problems.

SUMMARY OF THE INVENTION

Here, a method for manufacturing a fin field-effect transistor (FinFET) according to the invention is provided. The method is free of restriction on the resolution limit of the conventional photolithography process, and suitable for manufacturing fin-shaped structures characterized by an integral multiple of pitches and a non-integral multiple of pitches simultaneously.

In order to achieve the above and other advantages, the invention provides a method for manufacturing a FinFET, comprising: forming a first multi-layer structure and a second multi-layer structure on a substrate sequentially; forming a first sacrificial pattern on the second multi-layer structure, wherein the first sacrificial pattern is composed of a plurality of first mandrels and a second mandrel, and the adjacent first mandrels are separated with a first interval, and the adjacent first and second mandrels are separated with a second interval; forming a first spacer with a first width on a sidewall of the first sacrificial pattern, and forming a merging spacer with a second width between the adjacent first mandrels, wherein the first interval is the same as the second width and less than twice of the first width, and the second interval is larger than twice of the first width; removing the first sacrificial pattern; etching away a portion of the second multi-layer structure, by use of the first spacer and the merging spacer as a hard mask, so that a second sacrificial pattern is formed; forming a second spacer on a sidewall of the second sacrificial pattern; removing the second sacrificial pattern; etching away a portion of the first multi-layer structure, by use of the second spacer as a hard mask, so that the first multi-layer structure is patterned; and etching away a portion of the substrate, by use of the patterned first multi-layer structure as a hard mask, so that a plurality of first fin-shaped structures having a first pitch therebetween and a plurality of second fin-shaped structures having a second pitch therebetween are formed, wherein the first pitch is a non-integral multiple of the second pitch.

In summary, according to the invention, the intervals existed between the first mandrels and the second mandrels and respective widths of the first mandrels and the second mandrels are purposely modified. The most important is a first interval between the adjacent first mandrels is purposely modified as shorter than twice of thicknesses of a nitride layer, which is subsequently devoted to the first spacer. Therefore, a merging spacer can be generated between the adjacent first mandrels resulted from the union of respective spacers of the adjacent first mandrels, instead of respective spacers of the adjacent first mandrels being separated from each other customarily. Besides, through a plurality of sidewall pattern-transferring processes, it is able to manufacture a FinFET composed of fin-shaped structures characterized by a non-integral multiple of pitches (such as 45 nanometers, as a non-integral multiple of 32 nanometers) as well as an integral multiple of pitches (such as an integral multiple of 32 nanometers). Accordingly, it is possible to overcome the resolution limit of the conventional photolithography process, as well as the restriction of mere integral multiple of pitches, and accomplish various structures of respective functional areas in the device.

For making the above and other purposes, features and benefits become more readily apparent to those ordinarily skilled in the art, the preferred embodiments and the detailed descriptions with accompanying drawings are set forth in the following descriptions.

BRIEF DESCRIPTION OF THE DRAWINGS

The invention will become more readily apparent to those ordinarily skilled in the art after reviewing the following detailed description and accompanying drawings, in which.

DETAILED DESCRIPTION OF PREFERRED EMBODIMENTS

The invention will now be described more specifically with reference to the following embodiment. It is to be noted that the following descriptions of the preferred embodiment are presented herein for purpose of illustration and description only. It is not intended to be exhaustive or to be limited to the precise form disclosed.

Figure 1A:
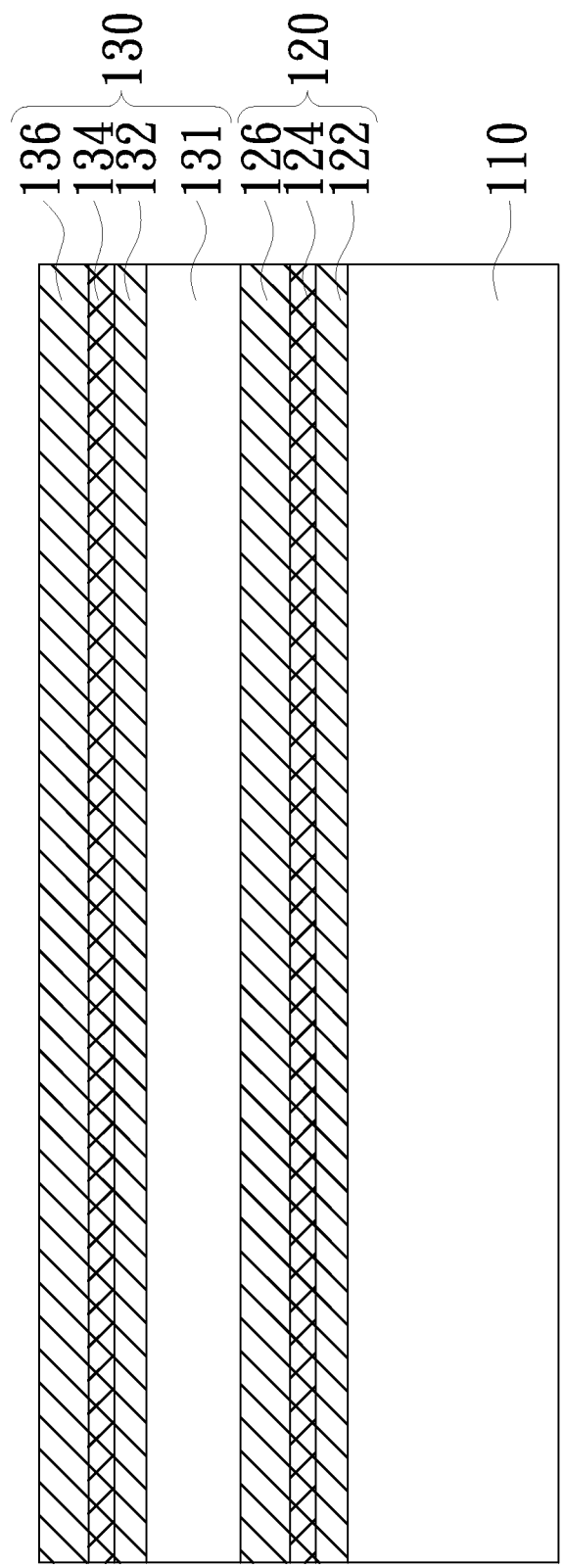
FIGS. 1A-1N are flowcharts illustrating a method for manufacturing a FinFET according to one embodiment of the invention.
Figure 1B:
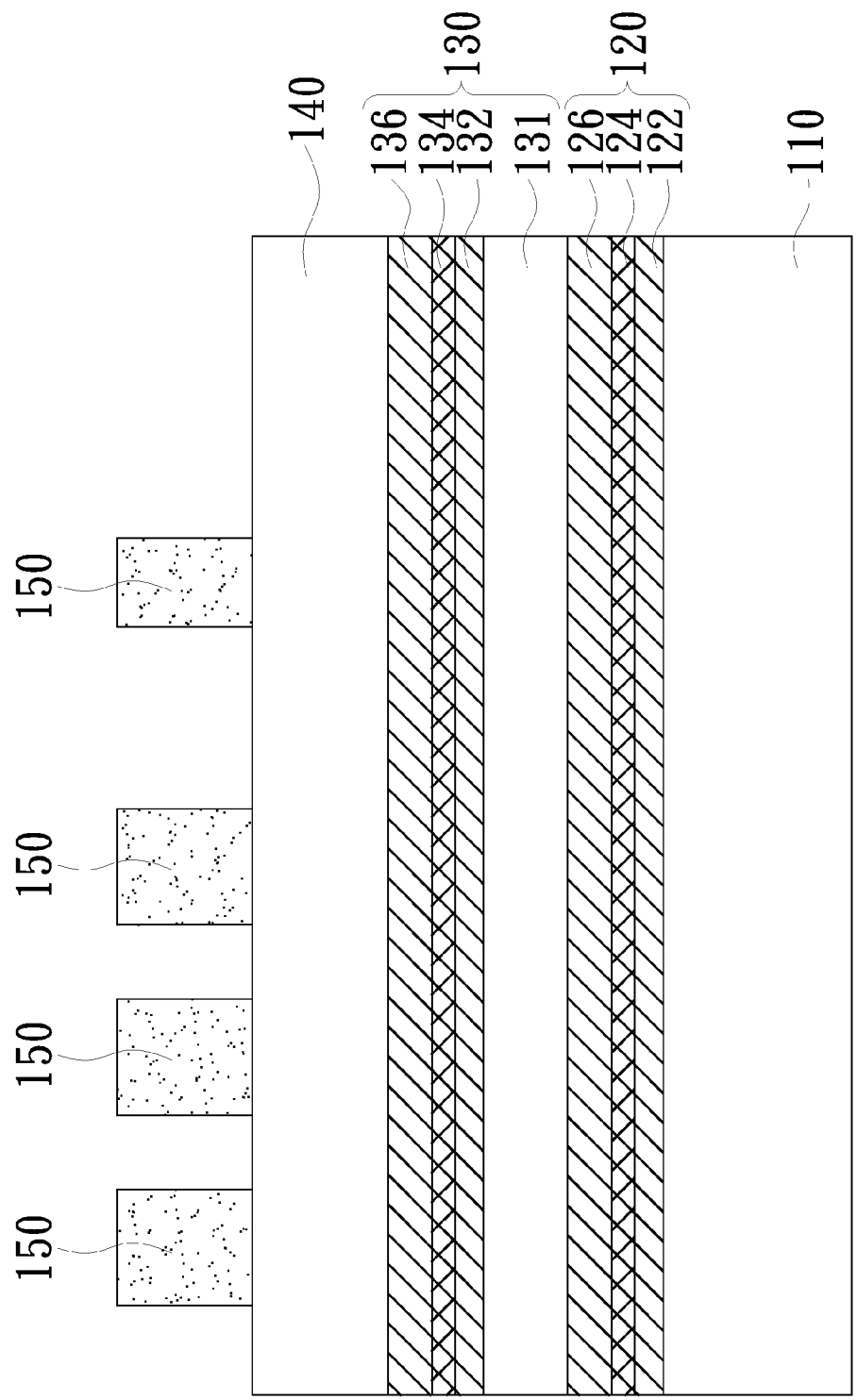
Figure 1C:
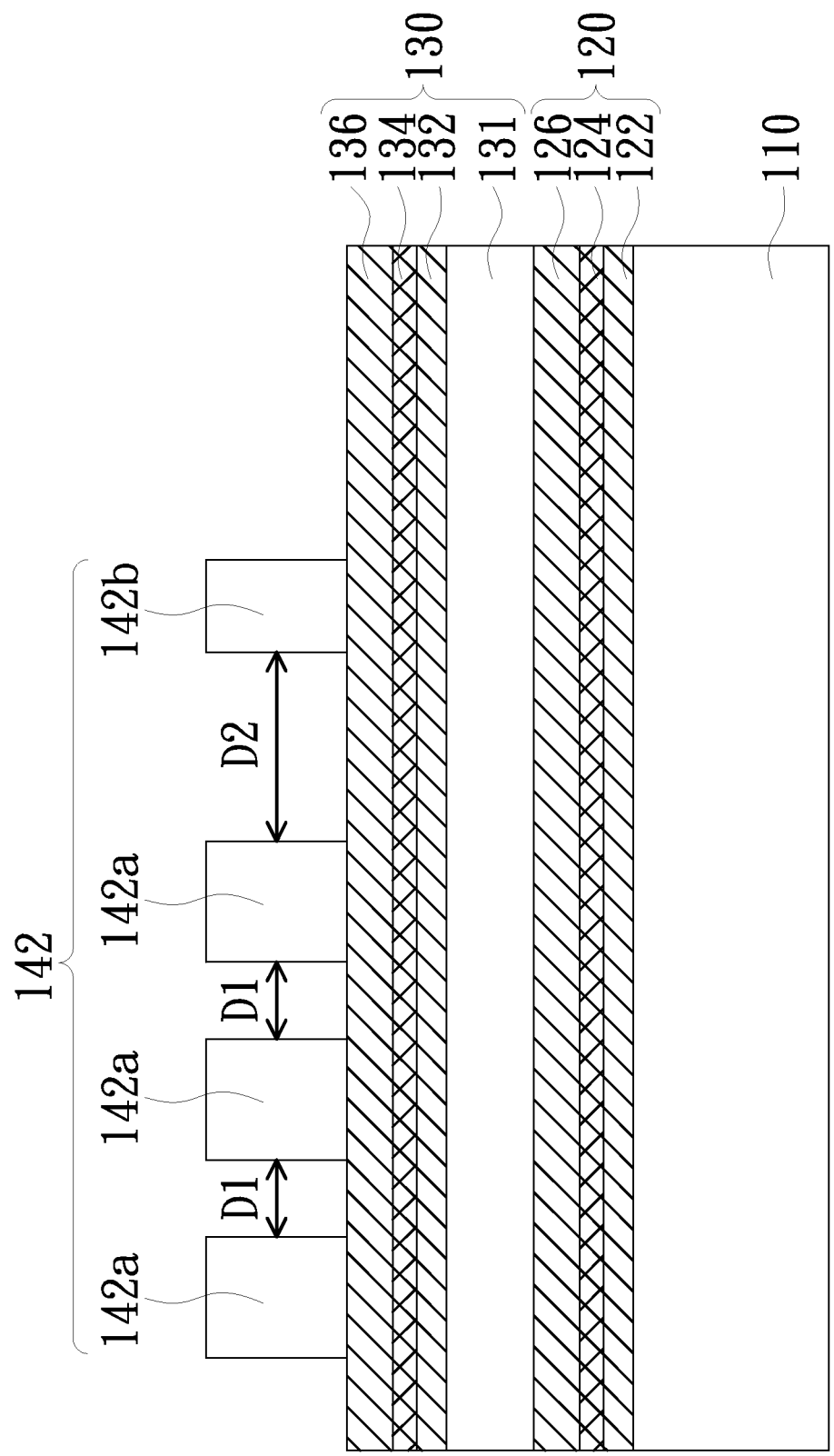
Figure 1D:
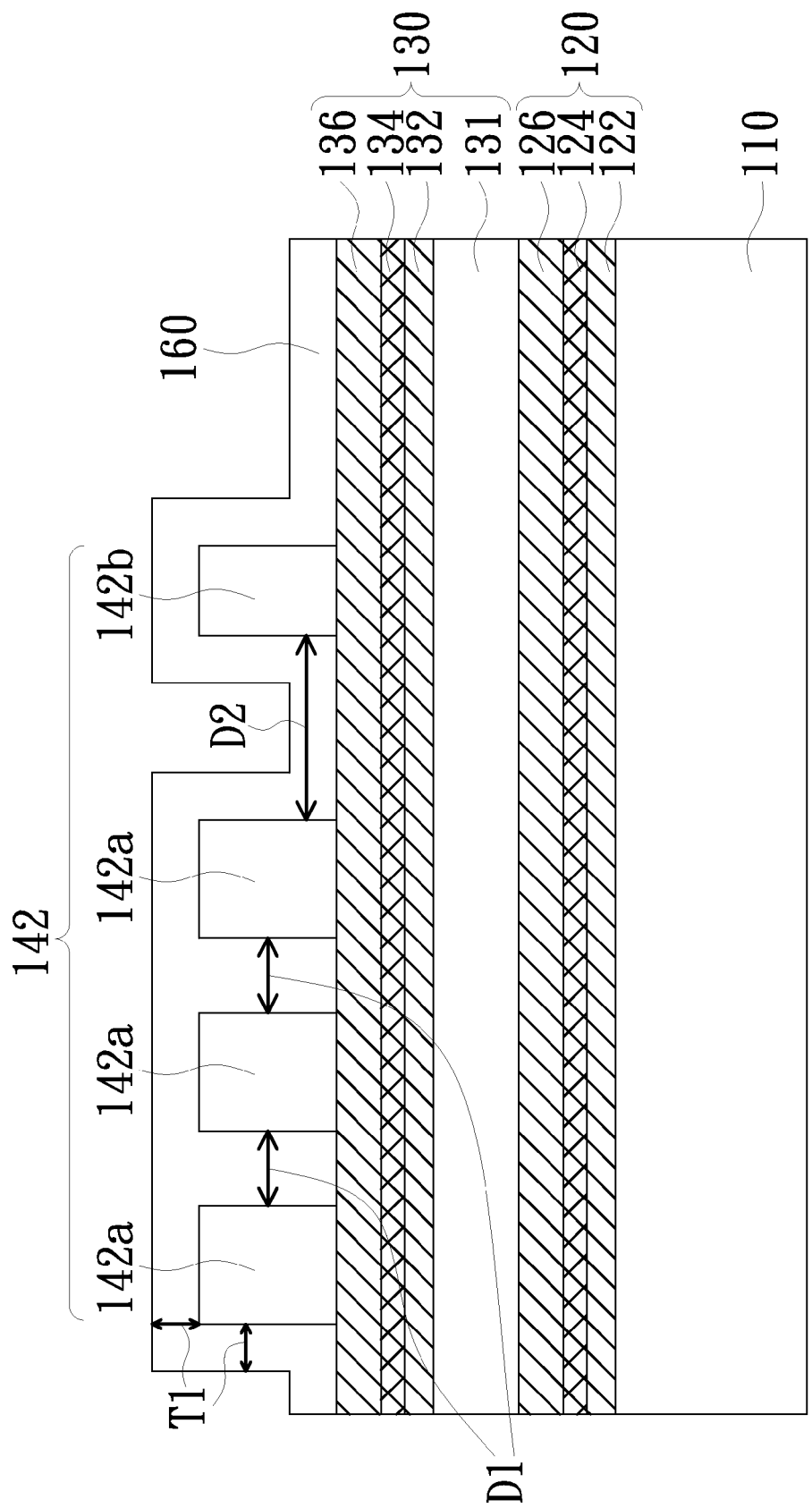
Figure 1E:
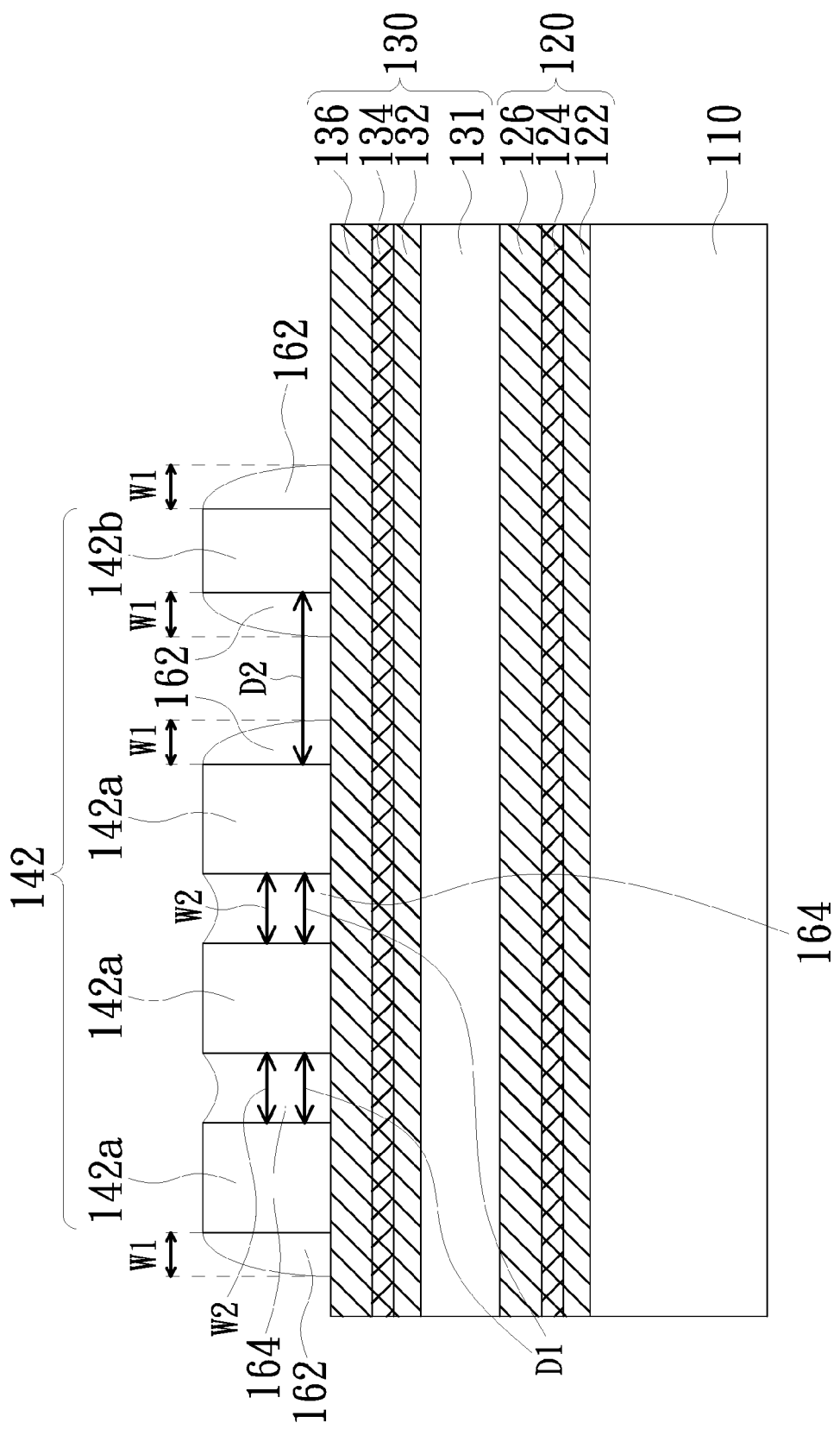
Figure 1F:
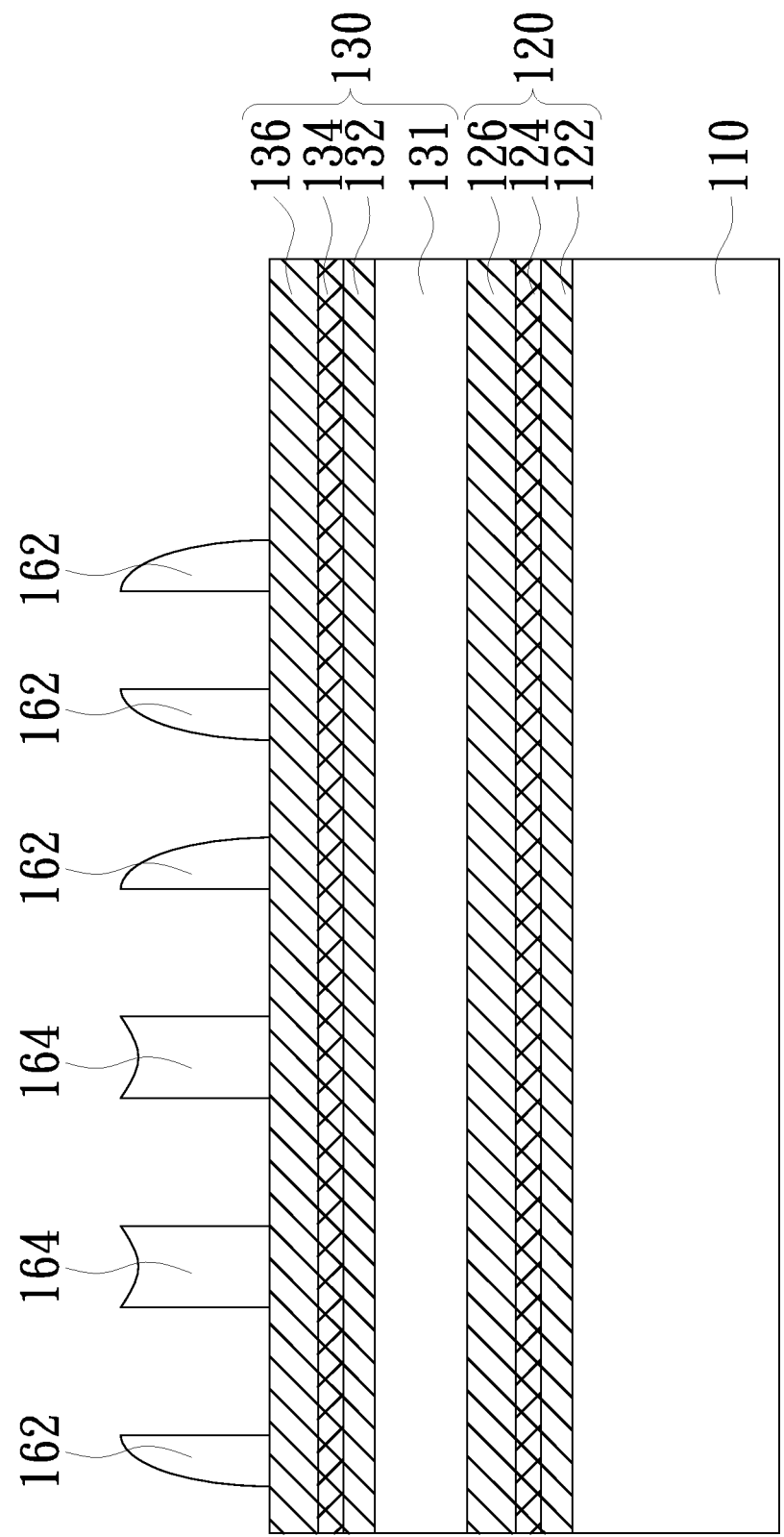
Figure 1G:
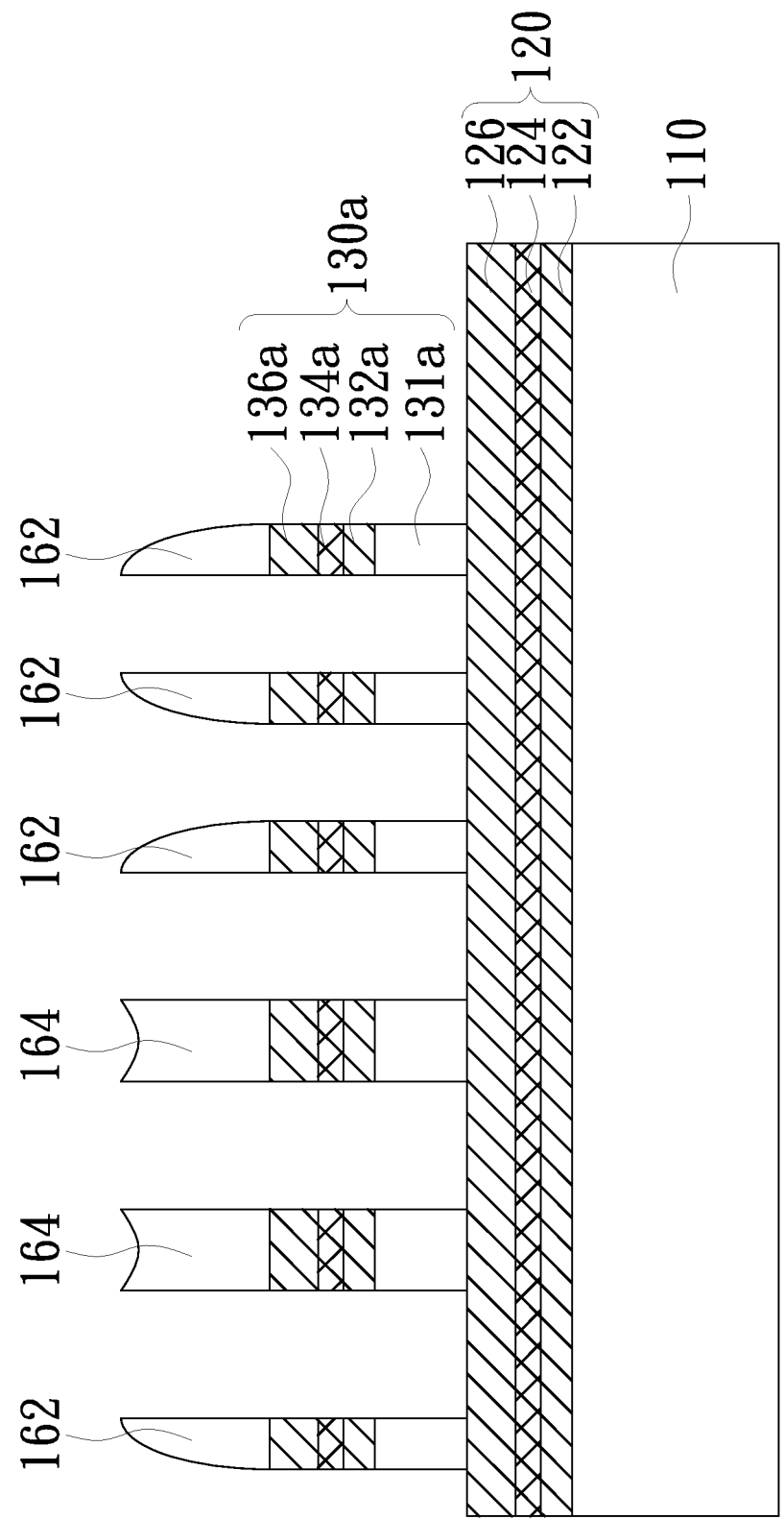
Figure 1H:
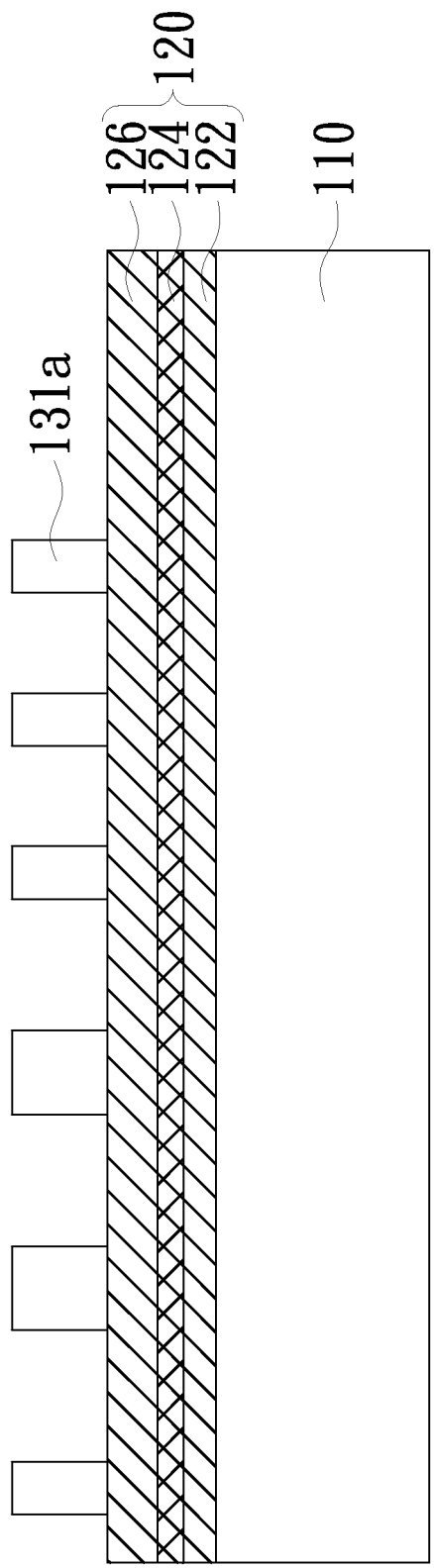
Figure 1I:
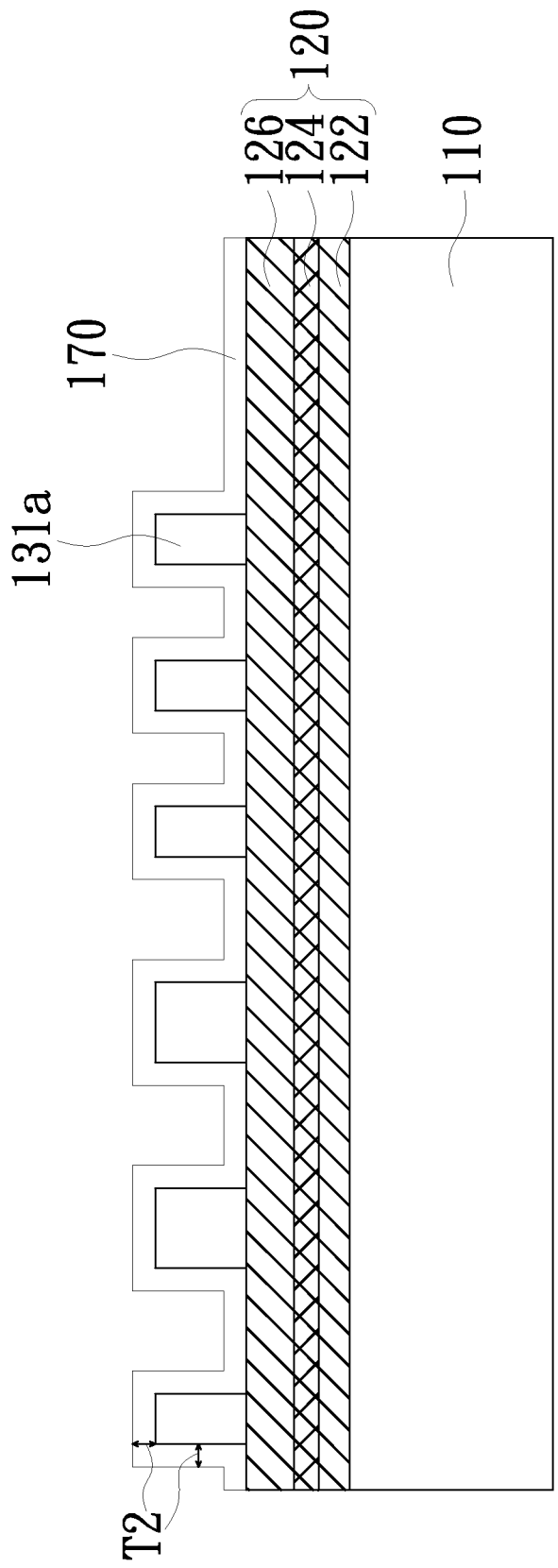
Figure 1J:
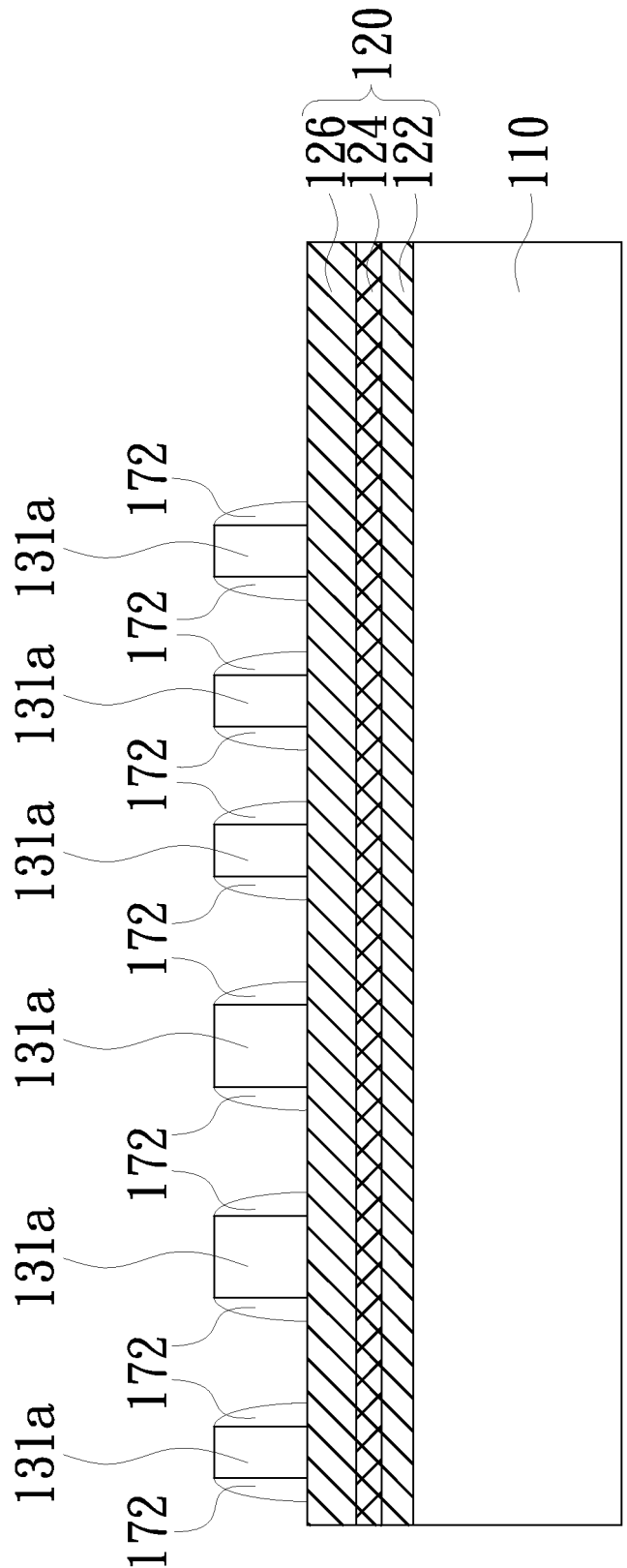
Figure 1K:
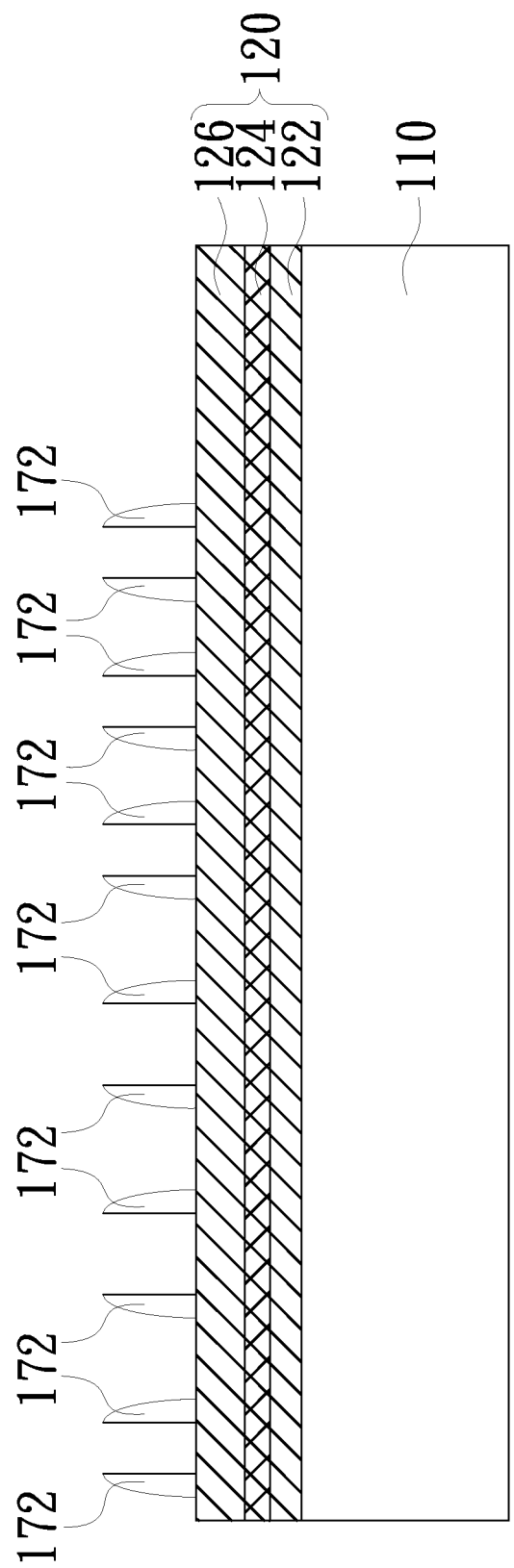
Figure 1L:
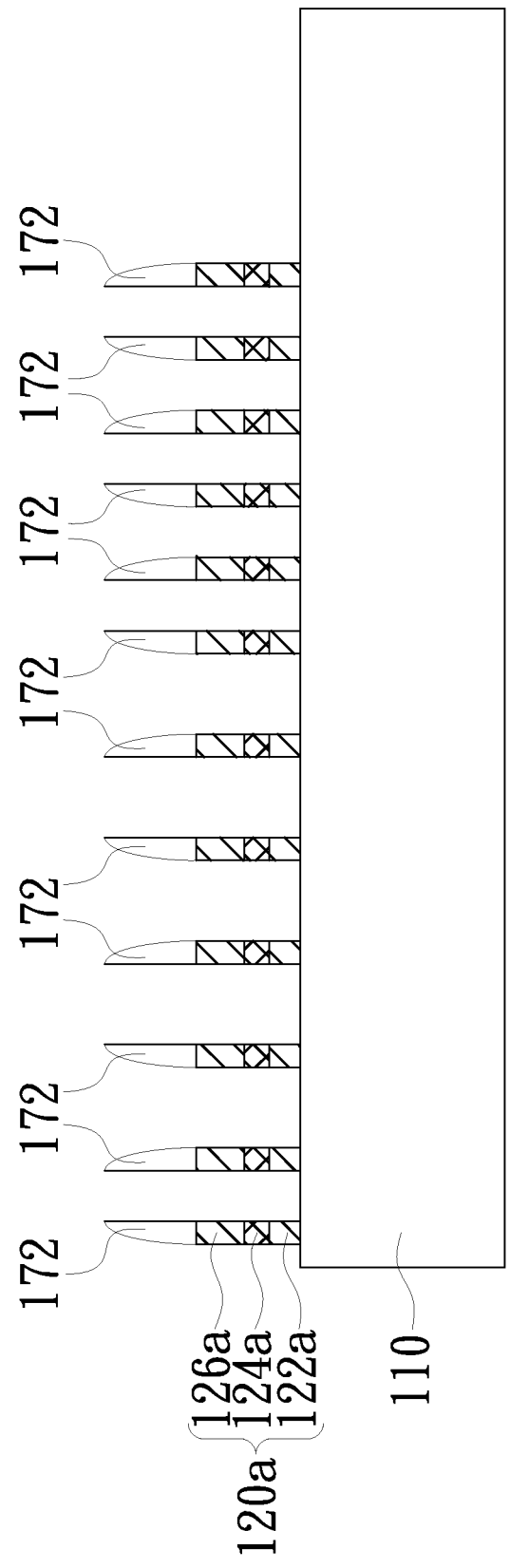
Figure 1M:
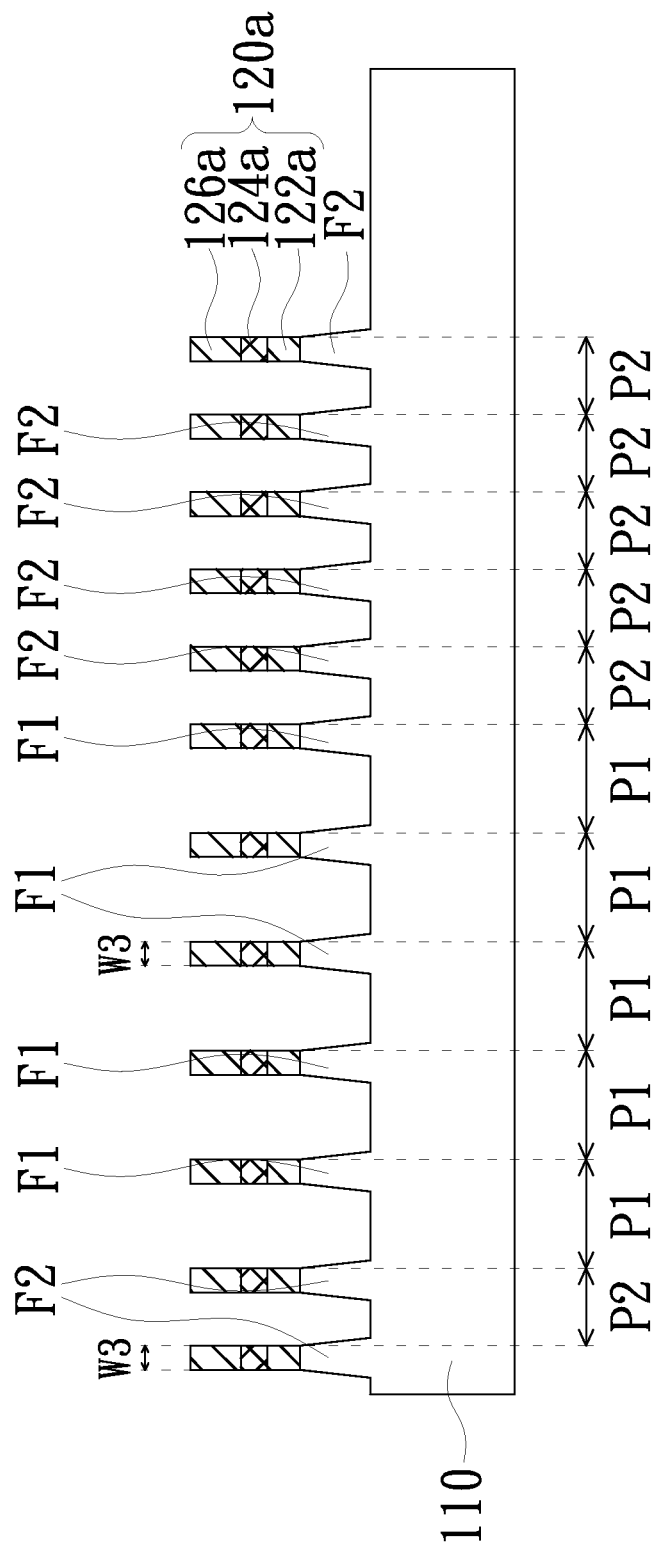
Figure 1N:
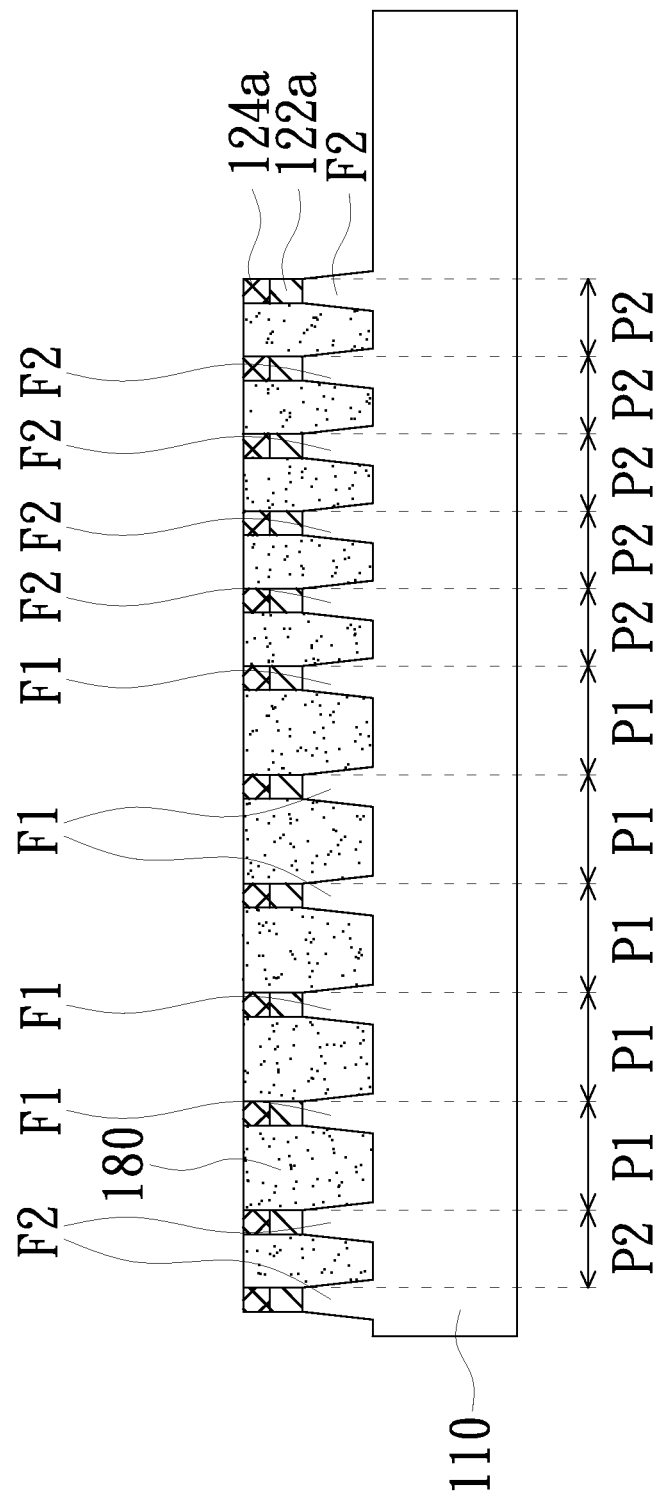

FIGS. 1A-1N are flowcharts illustrating a method for manufacturing a FinFET according to one embodiment of the invention. Firstly, by referring to FIG. 1A, a method for manufacturing a FinFET according to the embodiment includes providing a substrate 110, wherein the substrate 110 is a silicon substrate or a doped silicon substrate. Next, a stacked multi-layer structure is formed on the substrate 110, for example, a first multi-layer structure 120 and a second multi-layer structure 130 are formed and stacked sequentially on the substrate 110, respectively. Here, both of the first multi-layer structure 120 and the second multi-layer structure 130 are composed of two or more layers of thin films; any two adjacent (thin film) layers are formed of different materials, and the materials of any two adjacent (thin film) layers in the above-mentioned stacked multi-layer structures have distinct etching rates during etching processes.

Steps of forming the first multi-layer structure 120 includes, for example, forming a buffer layer 122, a bottom layer 124 and a top layer 126 on the substrate 110 sequentially. Further, steps of forming the second multi-layer structure 130 includes, for example, forming a sacrificial layer 131, a buffer layer 132, a bottom layer 134 and a top layer 136 on the top layer 126 of the first multi-layer structure 120 sequentially. Here, respective materials of the buffer layer 122, the buffer layer 132, the bottom layer 124, the bottom layer 134, the top layer 126 and the top layer 136 are oxide or nitride, for example, such as silicon oxide or silicon nitride; meanwhile, any two adjacent (thin film) layers are formed of different materials. A material of the sacrificial layer 131 is a silicide of, for example, polysilicon or amorphous silicon. In this embodiment, it is exemplified, but not limited, the buffer layer 122 as a first oxide layer, the bottom layer 124 as a first nitride layer, the top layer 126 as a second oxide layer, the sacrificial layer 131 as an amorphous silicon layer, the buffer layer 132 as a third oxide layer, the bottom layer 134 as a second nitride layer, and the top layer 136 as a fourth oxide layer.

Moreover, the first multi-layer structure 120 and the second multi-layer structure 130 are generated or produced by use of technologies of Physical Vapor Deposition (PVD), Chemical Vapor Deposition (CVD), Atomic Layer Deposition (ALD), thermal oxidation process, and so on. According to another embodiment, various materials of layers can be stacked up sequentially.

Next, referring to FIGS. 1B-1C at the same time, after forming the second multi-layer structure 130, the method for manufacturing the FinFET according to one embodiment of the present invention further includes forming a sacrificial layer 140 on the top layer 136 (fourth oxide layer) of the second multi-layer structure 130, and then, photomask and photolithography (lithography) processes are employed for forming a patterned photoresisit layer 150 on the sacrificial layer 140 (as shown in FIG. 1B). Next, an etching process, for example, an anisotropic etching process, is performed on the sacrificial layer 140 by use of the patterned photoresisit layer 150 as a hard mask, so that a portion of the sacrificial layer 140 is removed and a portion of the top layer 136 (fourth oxide layer) is exposed, and a first sacrificial pattern 142 is eventually created (as shown in FIG. 1C). For example, a material of the sacrificial layer 140 is amorphous silicon or polysilicon, and the photoresist layer is a single-layer or multi-layer structure. The first sacrificial pattern 142 is composed of a plurality of first mandrels 142a and at least one second mandrel 142b; an interval between the adjacent first mandrels 142a is a first interval D1, and an interval between the adjacent first and second mandrels 142a, 142b is a second interval D2 (as shown in FIG. 1C). The anisotropic etching process is, for example, a dry etching process, by use of carbon tetrafluoride (CF$_4$)/nitrogen gas (N$_2$) or chlorine gas (Cl$_2$) as an etching gas.

Next, referring to FIGS. 1D-1E, after forming the first sacrificial pattern 142, the method for manufacturing the FinFET according to one embodiment of the present invention further includes forming a nitride layer 160 with a first thickness T1 on the top layer 136 (fourth oxide layer) of the second multi-layer structure 130 and the first sacrificial pattern 142, respectively, in which one portion of the nitride layer 160 being contoured to the first sacrificial pattern 142, and an another portion of the nitride layer 160 being filled in cavities between the adjacent first mandrels 142a (as shown in FIG. 1D), wherein a material of the nitride layer 160 is silicon nitride, an anisotropic etching process, for example, a dry etching process is performed on the nitride layer 160, so that a first spacer 162 with a first width W1 can be formed on a sidewall of the first sacrificial pattern 142, and a merging spacer 164 with a second width W2 can be formed between the adjacent first mandrels 142a (as shown in FIG. 1E). Here, the above-described first thickness T1 of the nitride layer 160 is the same as the first width W1 of the first spacer 162, the first interval D1 of the adjacent first mandrels 142a is the same as the second width W2 of the merging spacer 164 and shorter than twice of the first width W1, and the second interval D2 of the interval between the adjacent first and second mandrels 142a, 142b is longer than twice of the first width W1.

It is worthy to mention that, the above-described step of forming the nitride layer 160 on the top layer 136 (fourth oxide layer) of the second multi-layer structure 130 is carried out, for example, by ALD for forming the nitride layer 160. Alternatively, other deposition approaches can be employed as long as it is suitable for depositing the material on the top layer 136 in a uniform manner, wherein the material is contoured to the first sacrificial pattern 142, and sufficiently fills in the clearance between the adjacent first mandrels 142a. It is to be noted that, when the nitride layer 160 is formed by use of CVD, it will probably to incur air gaps which are encapsulated within the nitride layer 160 as filled in the adjacent first mandrels 142a, since the width of the first interval D1 of the adjacent first mandrels 142a is extremely narrow. Further, after the dry etching is carried out on the nitride layer 160, it will be improbable to generate the merging spacers 154 with a perfect second width W2, resulting in failure of subsequent processes. Thus, the CVD is not adaptable to the formation of the nitride layer 160.

Next, referring to FIGS. 1E-1G at the same time, after forming the first spacers 162 and the merging spacers 164, the method for manufacturing the FinFET of the one embodiment further includes removing the first sacrificial pattern 142, retaining the first spacers 162 and the merging spacers 164 which are located on the top layer 136 (fourth oxide layer) (as shown in FIGS. 1E-1F), etching away a portion of the second multi-layer structure 130, by use of the first spacers 162 and the merging spacers 164 as hard masks, so as to form a plurality of second sacrificial patterns 130a, wherein each second sacrificial pattern 130a is composed of a sacrificial layer 131a, a buffer layer 132a, a bottom layer 134a and a top layer 136a beneath the first spacer 162 and the merging spacer 164 (as shown in FIG. 1G). Up to now, a first pattern-transferring process is accomplished. The pattern-transferring process is also called a sidewall image-transferring (hereinafter referred to as SIT) process. A material constituting a layer (such as the top layer 136) in the second multi-layer structure 130, that is the most apart or distant from the first multi-layer structure 120, has a distinct etching rate from that of a material constituting the first spacer 162.

Next, referring to FIGS. 1G-1J at the same time, after forming the second sacrificial patterns 130a, the method for manufacturing the FinFET further includes removing the first spacers 162, the merging spacers 164, the buffer layers 132a, the bottom layers 134a and the top layers 136a in the second sacrificial patterns 130a, while retaining the sacrificial layers 131a in each second sacrificial pattern 130a (as shown in FIGS. 1G-1H); then, forming a nitride layer 170 with a second thickness T2 on the top layer 126 (second oxide layer) and the sacrificial layers 131a, one portion of the nitride layer 170 being contoured to the sacrificial layers 131a (as shown in FIG. 11), wherein a material of the nitride layer 170 is, for example, silicon nitride, and an anisotropic etching, for example, a dry etching process is performed on the nitride layer 170, so as to form a plurality of second spacers 172 on each sidewall of the sacrificial layers 131a (as shown in FIG. 1J). The nitride layer 170 can be formed by, for example, ALD. Here, the second spacer 172 has a width as the same as the second thickness T2 of the nitride layer 170.

Next, referring to FIGS. 1J-1L at the same time, after forming the second spacer 172, the method for manufacturing the FinFET further includes removing the sacrificial layers 131a, retaining the second spacers 172 located on the top layer 126 of the first multi-layer structure 120 (as shown in FIGS. 1J-1K); and then, etching away a portion of the first multi-layer structure 120, by use of the second spacers 172 as hard masks, so that the first multi-layer structure 120 can be patterned (as shown in FIG. 1L). Here, each patterned first multi-layer structure 120a is composed of a buffer layer 122a, a bottom layer 124a and a top layer 126a beneath the second spacer 172. Moreover, a material constituting a layer (such as the top layer 126) in the first multi-layer structure 120, that is the most apart or distant from the substrate 110, has a distinct etching rate from that of a material constituting the second spacer 172. Up to now, a second pattern-transferring process is accomplished.

Next, referring to FIGS. 1M-1N at the same time, after the first multi-layer structure 120 being patterned, the method for manufacturing the FinFET further includes removing the second spacers 172, and etching away a portion of the substrate 110, by use of the patterned first multi-layer structures 120a as hard masks, so as to form a plurality of first fin-shaped structures F1 having a first pitch P1 and a plurality of second fin-shaped structures F2 having a second pitch P2 (as shown in FIG. 1M), wherein the first pitch P1 is a non-integral multiple of the second pitch P2. Next, the method for manufacturing the FinFET of the one embodiment includes removing the top layers 126a, filling in shallow trenches existed between the adjacent first fin-shaped structures F1, the adjacent second fin-shaped structures F2, the adjacent first and second fin-shaped structures F1, F2 with an insulating material layer 180, and planarizing the insulating material layer 180, so that the top surface of the insulating material layer 180 is flush with that of the bottom layer 124a (as shown in FIG. 1N). Accordingly, with the configuration of the plurality of shallow trenches filled with the insulating material layer 180, it will be suitable to carry out subsequent processes relevant to manufacturing the FinFET, such as the formation of a gate structure, and so on.

Moreover, the first fin-shaped structures F1 and the second fin-shaped structures F2 have a third width W3, respectively, the above-described first pitch P1 is a sum of the third width W3 of the first fin-shaped structure F1 and one interval between the adjacent first fin-shaped structures F1, and the above second pitch P2 is a sum of the third width W3 of the second fin-shaped structure F2 and one interval between the adjacent second fin-shaped structures F2. The above-described third width W3 is the same as the second thickness T2 of the nitride layer 170. Further, the first pitch P1 is a sum of the first interval D1 and the third width W3. The third width W3 of a plurality of first fin-shaped structures F1 and a plurality of second fin-shaped structures F2 falls in a range between, for example, 10 nm and 15 nm. The first pitch P1 of a plurality of first fin-shaped structures F1 falls in a range between, for example, 40 nm and 50 nm. The second pitch P2 of a plurality of second fin-shaped structures F2 falls in a range between, for example, 30 nm and 35 nm.

It is worthy to mention that, according to one embodiment of the invention, a width of the first mandrel 142a is, for example, 55 nm, a width of the second mandrel 142b is, for example, 42 nm, a first interval D1 between the adjacent first mandrels 142a is, for example, 35 nm, the second interval D2 between the adjacent first and second mandrels 142a, 142b is, for example, 86 nm, the first thickness T1 of the nitride layer 160 is, for example, 22 nm, and the second thickness T2 of the nitride layer 170 is, for example, 10 nm. By utilizing the method for manufacturing the FinFET according to the invention, together with the above-described process conditions, it is able to manufacture a FinFET in the substrate 110, wherein the FinFET is composed of a plurality of first fin-shaped structures F1 having the first pitch P1 of 45 nm, as well as a plurality of second fin-shaped structures F2 having the second pitch P2 of 32 nm.

In summary, according to the invention, the intervals existed between the first mandrels and the second mandrels and respective widths of the first mandrels and the second mandrels are purposely modified. The most important is a first interval between the adjacent first mandrels is purposely modified as shorter than twice of thicknesses of a nitride layer, which is subsequently devoted to the first spacer. Therefore, a merging spacer can be generated between the adjacent first mandrels resulted from the union of respective spacers of the adjacent first mandrels, instead of respective spacers of the adjacent first mandrels being separated from each other as done customarily. Besides, through a plurality of sidewall pattern-transferring processes, it is able to manufacture a FinFET composed of fin-shaped structures having a non-integral multiple of pitches (such as 45 nanometers for one pitch, being a non-integral multiple of 32 nanometers of another pitch) as well as an integral multiple of pitches (such as an integral multiple of 32 nanometers). Accordingly, it is possible to overcome the resolution limit of the conventional photolithography process, as well as the restriction of mere integral multiple of pitches, and accomplish various structures of respective functional areas in the device.

While the disclosure has been described in terms of what is presently considered to be the most practical and preferred embodiments, it is to be understood that the disclosure needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A method for manufacturing a fin field-effect transistor (FinFET), comprising:
    forming a first multi-layer structure and a second multi-layer structure on a substrate sequentially;
    forming a first sacrificial pattern on the second multi-layer structure, wherein the first sacrificial pattern is composed of a plurality of first mandrels and a second mandrel, and the adjacent first mandrels are separated with a first interval, and the adjacent first and second mandrels are separated with a second interval;
    forming a first spacer with a first width on a sidewall of the first sacrificial pattern, and forming a merging spacer with a second width between the adjacent first mandrels, wherein the first interval is the same as the second width and less than twice of the first width, and the second interval is larger than twice of the first width;
    removing the first sacrificial pattern;

etching away a portion of the second multi-layer structure, by use of the first spacer and the merging spacer as a hard mask and forming a second sacrificial pattern;

forming a second spacer on a sidewall of the second sacrificial pattern;

removing the second sacrificial pattern;

etching away a portion of the first multi-layer structure, by use of the second spacer as a hard mask, and patterning the first multi-layer structure; and etching away a portion of the substrate, by use of the patterned first multi-layer structure as a hard mask, and forming a plurality of first fin-shaped structures having a first pitch therebetween, and a plurality of second fin-shaped structures having a second pitch therebetween, respectively, wherein the first pitch is a non-integral multiple of the second pitch.

2. The method according to claim 1, wherein the second multi-layer structure comprising of a plurality of layers, any two adjacent layers in the second multi-layer structure are formed of different materials, and a material constituting a layer in the second multi-layer structure, that is the most apart from the first multi-layer structure, has a distinct etching rate from that of a material constituting the first spacer.

3. The method according to claim 1, wherein the first multi-layer structure comprising of a plurality of layers, any two adjacent layers in the first multi-layer structure are formed of different materials, and a material constituting a layer in the first multi-layer structure, that is the most apart from the substrate, and a material constituting the second spacer have distinct etching rates.

4. The method according to claim 1, wherein forming the first multi-layer structure on the substrate includes forming a first oxide layer, a first nitride layer and a second oxide layer on the substrate sequentially, and wherein forming the second spacer on the sidewall of the second sacrificial pattern includes:

forming an additional nitride layer on the second oxide layer as well as the second sacrificial pattern, and a portion of the additional nitride layer being contoured to the second sacrificial pattern; and performing a dry etching process on the additional nitride layer, so that the second spacer is formed on the sidewall of the second sacrificial pattern.

5. The method according to claim 1, wherein forming the second multi-layer structure on the first multi-layer structure includes forming a silicide layer, a third oxide layer, a second nitride layer and a fourth oxide layer on the first multi-layer structure, and wherein forming the first spacer on the sidewall of the first sacrificial pattern includes:

forming an additional nitride layer with a first thickness on the fourth oxide layer, a portion of the additional nitride layer being contoured to the first sacrificial pattern, a portion of the additional nitride layer filling in a cavity between the adjacent first mandrels, wherein the first thickness of the additional nitride layer is the same as the first width of the first spacer; and performing a dry etching process on the additional nitride layer, so that the first spacer is formed on the sidewall of the first sacrificial pattern, as well as the merging spacer is formed between the adjacent first mandrels.

6. The method according to claim 5, wherein forming the additional nitride layer on the fourth oxide layer includes forming the additional nitride layer by use of an atomic layer deposition approach.

7. The method according to claim 1, further comprising:

filling a plurality of shallow trenches existing between the adjacent first fin-shaped structures, the adjacent second fin-shaped structures, and the adjacent first and second fin-shaped structures with an insulating material layer; and performing a planarization process on the insulating material layer.

8. The method according to claim 1, wherein the first fin-shaped structures and the second fin-shaped structures have a third width, and the first pitch is a sum of the third width of one of the first fin-shaped structures and an interval between the adjacent first fin-shaped structures, and the second pitch is a sum of the third width of the second fin-shaped structure and an interval between the adjacent second fin-shaped structures.

9. The method according to claim 8, wherein the first pitch is a sum of the first interval and the third width.

10. The method according to claim 8, wherein the third width of each of the first fin-shaped structures and the second fin-shaped structures falls in a range between 10 nm and 15 nm, and the first pitch of the first fin-shaped structures falls in a range between 40 nm and 50 nm, and the second pitch of the second fin-shaped structures falls in a range between 30 nm and 35 nm.

* * * * *